US010979059B1

United States Patent
Shalmani et al.

(10) Patent No.: US 10,979,059 B1
(45) Date of Patent: Apr. 13, 2021

(54) SUCCESSIVE APPROXIMATION REGISTER ANALOG TO DIGITAL CONVERTER BASED PHASE-LOCKED LOOP WITH PROGRAMMABLE RANGE

(71) Applicant: Ciena Corporation, Hanover, MD (US)

(72) Inventors: Soheyl Ziabakhsh Shalmani, Kanata (CA); Sadok Aouini, Gatineau (CA); Matthew Mikkelsen, Ottawa (CA); Hazem Beshara, Ottawa (CA); Tingjun Wen, Ottawa (CA); Mohammad Honarparvar, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/079,805

(22) Filed: Oct. 26, 2020

(51) Int. Cl.
*H03L 7/093* (2006.01)
*H03L 7/091* (2006.01)
*H03L 7/099* (2006.01)

(52) U.S. Cl.
CPC .............. *H03L 7/093* (2013.01); *H03L 7/091* (2013.01); *H03L 7/0992* (2013.01)

(58) Field of Classification Search
CPC ........ H03L 7/093; H03L 7/091; H03L 7/0992
See application file for complete search history.

(56) References Cited

U.S. PATENT DOCUMENTS

| 8,134,393 | B1* | 3/2012 | Nagaraj | H03L 7/083 327/156 |
| 10,895,850 | B1* | 1/2021 | Elkholy | H03M 1/066 |
| 2007/0247202 | A1* | 10/2007 | Lin | H03L 7/07 327/158 |
| 2007/0262799 | A1* | 11/2007 | Nagata | G01R 31/2884 327/158 |

(Continued)

OTHER PUBLICATIONS

T. Seong, Y. Lee, S. Yoo and J. Choi, "A 320-fs RMS Jitter and -75-dBc Reference-Spur Ring-DCO-Based Digital PLL Using an Optimal-Threshold TDC," IEEE Journal of Solid-State Circuits, vol. 54, No. 9, pp 2501-2512, Sep. 2019.

(Continued)

*Primary Examiner* — Adam D Houston
(74) *Attorney, Agent, or Firm* — Young Basile Hanlon & MacFarlane, P.C.

(57) ABSTRACT

Described herein are apparatus and methods for a successive approximation register (SAR) analog-to-digital (ADC) based phase-locked loop (PLL) with programmable range. A multi-bit digital phase locked loop includes a multi-bit phase frequency detector configured to output a multi-bit error signal based on a reference clock, a feedback clock sampled using the reference clock, and a threshold voltage, a multi-bit digital low pass filter configured to apply a variable gain to the multi-bit error signal, a current steered digital-to-analog converter configured to generate a control current based on a gain applied multi-bit error signal and multi-bit digital phase locked loop control parameters, a controlled oscillator configured to adjust a frequency of the controlled (Continued)

oscillator based on the control current to generate an output clock, the feedback clock being based on the output clock, and a programmable edge time controller configured to adjust a slope of an edge of the feedback clock.

20 Claims, 9 Drawing Sheets

(56) References Cited

U.S. PATENT DOCUMENTS

| | | | |
|---|---|---|---|
| 2009/0195275 A1* | 8/2009 | Friedman | H03L 7/093 327/156 |
| 2009/0195277 A1* | 8/2009 | Yamakido | H03L 7/093 327/158 |
| 2010/0039182 A1* | 2/2010 | Galton | H03L 7/0898 331/1 A |
| 2011/0090998 A1* | 4/2011 | Zhang | H03L 7/1976 375/365 |
| 2011/0133794 A1* | 6/2011 | Dunworth | H03L 7/08 327/156 |
| 2011/0133799 A1* | 6/2011 | Dunworth | H03L 7/085 327/157 |
| 2013/0051290 A1* | 2/2013 | Endo | H04L 27/0014 370/281 |
| 2013/0222023 A1* | 8/2013 | Lin | H03L 7/101 327/156 |
| 2013/0265114 A1* | 10/2013 | Lee | H03L 7/093 331/1 A |
| 2013/0343134 A1* | 12/2013 | Willey | G11C 11/4076 365/189.05 |
| 2014/0077849 A1* | 3/2014 | Chen | H03L 7/08 327/156 |
| 2014/0241467 A1* | 8/2014 | Huang | H03L 7/18 375/327 |
| 2015/0145566 A1* | 5/2015 | Perrott | H03L 7/0802 327/154 |
| 2015/0180485 A1* | 6/2015 | Shanan | H03L 7/104 327/156 |
| 2015/0222278 A1* | 8/2015 | Reichelt | H03K 5/135 327/156 |
| 2016/0056806 A1* | 2/2016 | Rapinoja | H03L 7/0816 327/158 |
| 2016/0065223 A1* | 3/2016 | Galton | H03L 7/187 327/159 |
| 2016/0126892 A1* | 5/2016 | Huang | H03B 5/1265 331/8 |
| 2016/0164527 A1* | 6/2016 | Song | H03L 7/087 327/158 |
| 2016/0337152 A1* | 11/2016 | Masui | H03G 3/3042 |
| 2017/0063386 A1* | 3/2017 | Hiraku | H03L 7/1075 |
| 2017/0264304 A1* | 9/2017 | Dedic | H03L 7/091 |
| 2017/0264333 A1* | 9/2017 | Hoshino | H03L 7/093 |
| 2018/0048232 A1* | 2/2018 | Adell | H03L 7/085 |
| 2018/0123605 A1* | 5/2018 | Salle | H03L 7/085 |
| 2018/0175868 A1* | 6/2018 | Stuhlberger | H03C 3/095 |
| 2018/0175947 A1* | 6/2018 | Tiebout | H03G 3/3036 |
| 2018/0302096 A1* | 10/2018 | Kuan | H03L 7/0891 |
| 2019/0131978 A1* | 5/2019 | Sjoland | H04L 5/0048 |
| 2019/0296750 A1* | 9/2019 | Jin | H03L 7/093 |
| 2019/0326915 A1* | 10/2019 | Moslehi Bajestan | H03L 7/093 |
| 2020/0028515 A1* | 1/2020 | Nagam | H03L 7/087 |
| 2020/0235743 A1* | 7/2020 | van der Weide | H03L 7/091 |
| 2020/0373927 A1* | 11/2020 | Liang | H03L 7/18 |

OTHER PUBLICATIONS

D. Kim and S. Cho, "A Hybrid PLL Using Low-Power GRO-TDC for Reduced In-Band Phase Noise," IEEE Transactions on Circuits and Systems II: Express Briefs, vol. 66, No. 2, pp. 232-236, Feb. 2019.

P. Chen et al., "High-Precision PLL Delay Matrix with Overclocking and Double Data Rate for Accurate FPGA Time-to-Digital Converters," IEEE Transactions on Very Large-Scale Integration (VLSI) Systems, Jan. 2020.

J. Wu et al., "A 77-GHz Mixed-Mode FMCW Generator Based on a Vernier TDC With Dual Rising-Edge Fractional-Phase Detector," IEEE Transactions on Circuits and Systems I: Regular Papers, vol. 67, No. 1, pp. 60-73, Jan. 2020.

\* cited by examiner

SUCCESSIVE APPROXIMATION REGISTER ANALOG TO DIGITAL CONVERTER BASED PHASE-LOCKED LOOP WITH PROGRAMMABLE RANGE

TECHNICAL FIELD

This disclosure relates to phase-locked loops.

BACKGROUND

Digital phase-locked loops (DPLLs) have been widely used in frequency synthesizers as well as for clock and data recovery (CDR). A DPLL has several advantages such as consuming low area and power, scalability, and portability across different process technology nodes in contrast with its analog counterparts. While analog PLLs suffer from long locking time, consuming more power, and sensitivity to process, voltage and temperature (PVT) variations, DPLLs suffer from high jitter performance induced by power supply noise. Another circuit that restricts DPLL design specifications (i.e., jitter and phase noise) is the phase-frequency detector (PFD). Dead-zones of PFDs, non-linearity, and phase offset error in the closed-loop are the main issues in conventional designs.

Conventional approaches to realize a DPLL or CDR use Time-to-digital converter (TDC)-based PFD or bang-bang PFDs (BBPFD) which limits the jitter performance significantly. TDCs have been explored to operate as a PFD with better accuracy, however, its resolution is limited to a unit delay. There have been several approaches to implement a TDC-based PFD with sub-delay resolution such as a Flash TDC, a pulse shrinking TDC, and a Vernier delay line (VDL) TDC including two and three-dimension Vernier TDCs. However, mismatches between delay elements, leakage, and being susceptible to PVT variations degrade the performance of these PLLs. For example, the PFD block is limited to a 1-bit or a low-resolution multi-bit TDC which degrades the performance significantly. Consequently, more effort is needed for on-chip or off-chip calibration system to improve performance.

BBPFDs use a D-Flipflop (DFF) in its architecture and generates either a logic 1 or logic 0 to denote when the reference clock is leading or lagging the feedback clock coming from a voltage controlled oscillator (VCO) or digitally controlled oscillator (DCO) regardless of the input time-difference amplitude. The BBPFD operates like a 1-bit quantizer with limited jitter performance.

Both the TDC-based PFD and BBPFD limit design specifications due to PVT variations and mismatches. In some designs, the dynamic range of the loop is static in the previous DPLL implementations, which use a single-bit proportional and integral (PI) path control. For example, these designs have a single bit input to $K_P$ and single bit accumulator whose gain is controlled by $K_I$. In order to have more flexibility in these designs, an externally controlled, complicated digital circuit is used. This increases the complexity of the design and chip area. Other DLPF designs control the $K_I$ path using a single-bit PFD.

Asynchronous SAR ADCs reported so far use an internal fast oscillator to resolve the bits after sampling. Due to PVT variations and parasitic components, the duty cycle and frequency of the fast clock are changed. This limits the settling time of an internal capacitor-based digital-to-analog (DAC) inside the SAR ADC.

SUMMARY

Described herein are apparatus and methods for a successive approximation register (SAR) analog-to-digital (ADC) based phase-locked loop (PLL) with programmable range.

In implementations, a multi-bit digital phase locked loop includes a multi-bit phase frequency detector configured to output a multi-bit error signal based on a reference clock, a feedback clock sampled using the reference clock, and a threshold voltage, a multi-bit digital low pass filter connected to the multi-bit phase frequency detector, the multi-bit digital low pass filter configured to apply a variable gain to the multi-bit error signal, a current steered digital-to-analog converter connected to the multi-bit digital low pass filter, the current steered digital-to-analog converter configured to generate a control current based on a gain applied multi-bit error signal and multi-bit digital phase locked loop control parameters, a controlled oscillator connected to the current steered digital-to-analog converter, the controlled oscillator configured to adjust a frequency of the controlled oscillator based on the control current to generate an output clock, the feedback clock being based on the output clock, and a programmable edge time controller configured to adjust a slope of an edge of the feedback clock.

In implementations, the multi-bit phase frequency detector comprises a multi-bit successive approximation register (SAR) analog-to-digital (ADC) configured to sample the feedback clock using the reference clock at a defined duty cycle and to resolve the sampled frequency clock to generate a multi-bit signal based on a fast clock. In implementations, the multi-bit digital phase locked loop further includes a divider configured to divide the output clock to generate the fast clock. In implementations, the multi-bit phase frequency detector comprises a digital subtractor configured to subtract a digital code representative of the threshold voltage from the multi-bit signal to generate the multi-bit error signal. In implementations, the multi-bit digital low pass filter includes a variable multi-bit proportional path gain ($K_P$) circuit configured to apply a $K_P$ to the multi-bit error signal to generate a $K_P$ gain applied multi-bit error signal and to generate an arbiter control bit from a most significant bit of the multi-bit error signal, wherein the arbiter control bit governs application of the $K_P$ gain applied multi-bit error signal at the current steered digital-to-analog converter, and a variable multi-bit integral path gain ($K_I$) circuit configured to apply a $K_I$ to the multi-bit error signal to generate a $K_I$ gain applied multi-bit error signal, where the gain applied multi-bit error signal includes at the $K_P$ gain applied multi-bit error signal and the $K_I$ gain applied multi-bit error signal, and where the variable multi-bit proportional path gain ($K_P$) circuit and the variable multi-bit integral path gain ($K_I$) circuit are controlled by a digital low pass filter controller. In implementations, the variable multi-bit integral path gain ($K_I$) circuit includes an accumulator configured to integrate a phase error from the multi-bit error signal, wherein a reaction time of the accumulator is controlled by the digital low pass filter controller, and a variable multi-bit integral path gain ($K_I$) configured to apply the $K_I$ to an output of the accumulator to generate the $K_I$ gain applied multi-bit error signal. In implementations, the multi-bit phase frequency detector provides a clock signal for the accumulator which is controlled by the digital low pass filter controller based on trading off jitter versus acquisition time. In implementations, the variable multi-bit proportional path gain ($K_P$) circuit and the variable multi-bit integral path gain ($K_I$) circuit each comprise a shift register, wherein a most significant bit section is set to ground or 0 volts, a least significant bit section is set to positive supply voltage, and a middle section is set to least significant bits of the multi-bit error signal. In implementations, the programmable edge time controller comprises a binary-to-thermometer circuit connected to a plurality of switched capacitor legs, wherein the binary-to-thermometer circuit is configured to convert a N-bit digital code from an edge time controller into $2^N$ bits, each bit controlling one switched capacitor leg of the plurality of switched capacitor legs. In implementations, the multi-bit digital phase locked loop further includes a duty cycle controller configured to provide the reference clock at the defined duty cycle.

In implementations, a N-bit digital phase locked loop includes a N-bit phase frequency detector to output a N-bit error signal based on a reference clock, a feedback clock, and a digital threshold code, a controlled oscillator configured to adjust a frequency of the controlled oscillator based on the N-bit error signal to generate an output clock, the feedback clock being based on the output clock, and a programmable rise/fall time controller in a feedback path of the N-bit digital phase locked loop configured to adjust a slope of the rise/fall time of the feedback clock to improve dynamic range. In implementations, the N-bit phase frequency detector comprises a N-bit successive approximation register (SAR) analog-to-digital (ADC) configured to sample the feedback clock using the reference clock at a defined duty cycle and to resolve the sampled frequency clock to generate a N-bit signal based on a fast clock provided by dividing the output clock, and a digital subtractor configured to subtract the digital threshold code from the N-bit signal to generate the N-bit error signal. In implementations, the N-bit digital phase locked loop further includes a current steered digital-to-analog converter configured to generate a control current based on a gain applied N-bit error signal and N-bit digital phase locked loop control parameters. In implementations, digital phase locked loop further includes a N-bit digital low pass filter configured to apply a variable gain to the multi-bit error signal. In implementations, the N-bit digital low pass filter includes a variable N-bit proportional path gain ($K_P$) circuit configured to generate a $K_P$ gain applied multi-bit error signal and to generate an arbiter control bit from a most significant bit of the multi-bit error signal, wherein the arbiter control bit governs application of the $K_P$ gain applied multi-bit error signal at a current steered digital-to-analog converter, and a variable multi-bit integral path gain ($K_I$) circuit configured to generate a $K_I$ gain applied multi-bit error signal using at least an accumulator having a clock provided by the N-bit phase frequency detector, where the variable multi-bit proportional path gain ($K_P$) circuit, the variable multi-bit integral path gain ($K_I$) circuit, and the clock are controlled by a digital low pass filter controller which accounts for jitter and acquisition time. In implementations, where the programmable rise/fall time controller comprises a binary-to-thermometer circuit connected to a plurality of switched capacitor legs, wherein the binary-to-thermometer circuit is configured to convert a N-bit digital code from an edge time controller into $2^N$ bits, each bit controlling one switched capacitor leg of the plurality of switched capacitor legs.

In implementations, a method includes generating a multi-bit signal from a feedback clock sampled based on a reference signal, generating a multi-bit error signal from the multi-bit signal, wherein a most significant bit of the multi-bit signal is a direction of a phase error between the reference clock and a sampled feedback clock and least significant bits represent a magnitude of the phase error between the reference clock and the sampled feedback clock, processing the multi-bit error signal through a multi-bit digital low pass filter, generating a control current from an output of the multi-bit digital low pass filter and control parameters, outputting an output clock based on the control current, the feedback clock being based on the output clock, and programming a fall/rise time of the feedback clock to improve dynamic range. In implementations, the generating a multi-bit error signal further comprises subtracting a digital code from the multi-bit signal, the digital code representing a digital threshold voltage which when subtracted from the multi-bit signal is proportional to a phase error between the feedback clock and the reference clock. In implementations, the processing the multi-bit error signal through a multi-bit digital low pass filter further includes applying a multi-bit proportional gain to the multi-bit error signal, and applying a multi-bit integral gain to the multi-bit error signal, where gain and application of the multi-bit proportional gain and the multi-bit integral gain is controlled based on jitter and acquisition time requirements. In implementations, the generating a control current comprises including multi-bit proportional gain when a control bit indicates that reference clock is leading the feedback clock.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Described herein are apparatus, devices, circuits, systems, and methods for a successive approximation register (SAR) analog-to-digital (ADC) based digital phase-locked loop (DPLL) with programmable range. In implementations, a N-bit SAR ADC can be used as a multi-bit phase frequency detector (PFD) to quantize the feedback signal coming from a voltage controlled oscillator (VCO) or a digitally controlled oscillator (DCO) into $2^N$ levels. In implementations, N can be 5. The N-bit SAR ADC helps maintain a very low jitter performance across process, voltage and temperature (PVT) variations as the high ADC resolution allows for the effective detection of very small amplitude. That is, an output digital code of the N-bit SAR ADC represents an input amplitude with high resolution. In implementations, the SAR ADC based DPLL with programmable range can be used for high frequency clock generation as well as for clock and data recovery (CDR). The SAR ADC based DPLL uses a large number of digital circuits, which reduces chip area usage. Moreover, power consumption is dynamic and not static.

In implementations, the SAR ADC based DPLL includes a multi-bit digital low-pass filter (DLPF) to support the input data from the SAR ADC. The multi-bit DLPF includes a variable integral gain path ($K_I$) and a variable proportional gain path ($K_P$) in order to tune the VCO frequency with high precision. The outputs of the DLPF as well as a DC offset controller ($K_{DC}$) and a bandwidth tuning controller ($K_{BW}$) are connected to a current-steering digital-to-analog DAC) (CSDAC), which in turn is connected to the VCO.

In implementations, jitter performance is improved by using the multi-bit PFD to convert the input amplitude to different phase steps. This implies that the output of the multi-bit PFD does not have binary values (0 and 1) or two outputs which are leading/lagging to each other. The multi-bit PFD compares the reference and feedback signals in multi-level of quantization with variable range on the time axis. A high-resolution multi-level PFD is provided by connecting a divided down VCO clock to the asynchronous SAR ADC, which has very accurate duty cycle and good jitter performance. The phase resolution of the closed-loop DPLL is controlled by programmable rise/fall times to optimize jitter performance. The frequency of the VCO and the range of dividers in the feedback path can be digitally tuned for desired applications. A multi-bit DLPF supports the multi-bit PFD by having multi-bit inputs for the $K_P$ and $K_I$ parameters within the multi-bit DLPF. Two other parameters, $K_{BW}$ and $K_{DC}$, are added to adjust the bandwidth and offset frequency, respectively. The closed-loop DPLL or SAR ADC DPLL can operate as both integer and fractional DPLLs.

In implementations, a fast clock for the SAR ADC is generated via a N-divided VCO clock to resolve the SAR ADC's bits to achieve promising jitter performance against PVT variations and mismatch. This reduces device complexity and saves area. Consequently, the SAR ADC based DPLL is a multi-bit PFD which does not need any internal fast clock generator. The multi-bit DPLL is designed to operate over a wide range of input rise and fall times with different reference clocks, while taking advantage of technology scaling.

In implementations, the number of output bits in the multi-bit PFD can be selected based on design specifications (i.e., 8-bit ADC) in order to optimize the phase resolution requirements to accurately track the loop. This is in contrast to conventional DPLL or fractional-N frequency synthesis where the performance is limited by the resolution of the BBPFD or TDC-based PFD.

Figure 1:
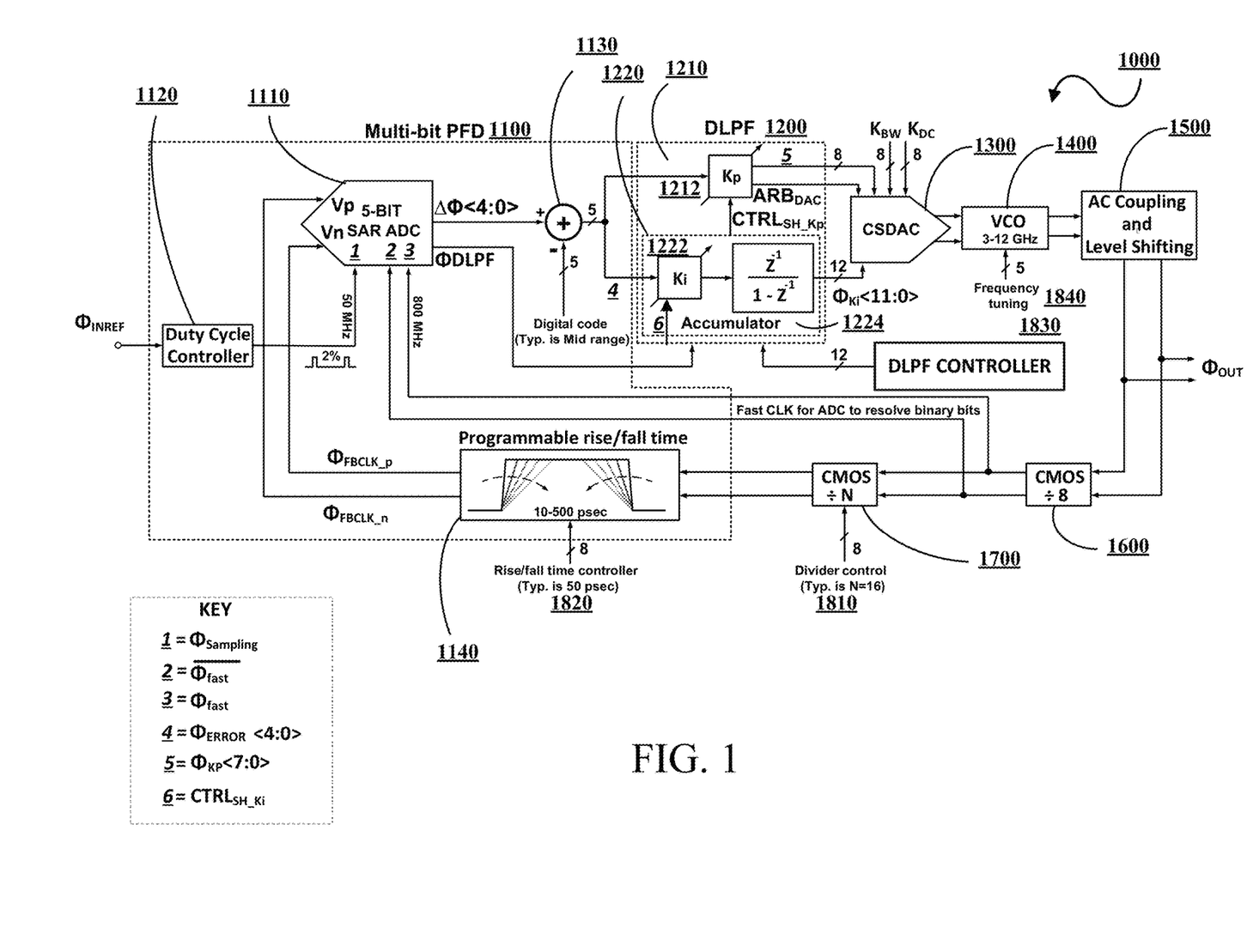
FIG. 1 is a block diagram of an example of a successive approximation register (SAR) analog-to-digital (ADC) based digital phase-locked loop (DPLL) with programmable range in accordance with embodiments of this disclosure.

FIG. 1 is a block diagram of an example of an asynchronous SAR) analog-to-digital (ADC) based DPLL 1000 with programmable range in accordance with embodiments of this disclosure. The SAR ADC based DPLL 1000 includes a multi-bit PFD 1100 connected to or in communication with (collectively "connected to") a multi-bit digital low pass filter (DLPF) 1200, which in turn is connected to a current steering digital-to-analog (CS DAC) 1300. The CS DAC 1300 is connected to VCO 1400, which is connected to an. The AC coupling and level shifting circuit 1500 to a first divider 1600, which is connected to a second divider 1700 and the multi-bit PFD 1100 to complete a feedback loop or path. The second divider 1700 is controllable by a divider controller 1810. It is noted that the controllers described herein are system controlled, user controlled, or combinations thereof as appropriate and applicable.

The multi-bit PFD 1100 includes a multi-bit or N-bit SAR ADC 1110 connected to a duty cycle controller 1120 and a digital subtractor 1130, which in turn is connected to the multi-bit DLPF 1200. In implementations, the multi-bit SAR ADC 1110 is a 5-bit SAR ADC. The description herein uses the 5-bit SAR ADC but N can be set in accordance with the requirements without departing from the scope of the specification or the claims. The multi-bit SAR ADC 1110 is also connected to the first divider 1600. The multi-bit PFD 1100 includes a programmable rise/fall time circuit 1140 which is connected to the multi-bit SAR ADC 1110 and the second divider 1700. The programmable rise/fall time circuit 1140 is controllable by a rise/fall time controller 1820. The multi-bit DLPF 1200 includes a variable multi-bit proportional path gain ($K_P$) circuit 1210 and a variable multi-bit integral path gain ($K_I$) circuit 1220, both of which are connected to the digital subtractor 1130 and a DLPF controller 1830. The variable multi-bit integral path gain ($K_I$) circuit 1220 is further connected to the multi-bit SAR ADC 1110. The variable multi-bit proportional path gain ($K_P$) circuit 1210 includes a variable multi-bit proportional path gain ($K_P$) 1212. The variable multi-bit integral path gain ($K_I$) circuit 1220 includes a variable multi-bit integral path gain ($K_I$) 1222 connected to an accumulator 1224.

Operationally, the SAR ADC based DPLL 1000 can output an output clock ($\phi_{OUT}$) based on a reference clock (denoted as $\phi_{INREF}$) and a feedback clock ($\phi_{FBCLK\_p}$ and $\phi_{FBCLK\_n}$). The reference clock is passed to the duty cycle controller 1120, which generates a sampling clock $\phi_{sampling}$) that is input to the multi-bit SAR ADC 1110 to sample the feedback clock ($\phi_{FBCLK\_p}$ and $\phi_{FBCLK\_n}$) The duty cycle controller 1120 produces a narrow pulse (2% duty cycle) for conversion and a long logic "0" value for bit acquisition. The multi-bit SAR ADC 1110 uses a divided down output clock ($\phi_{OUT}$) of the SAR ADC based DPLL 1000 as the fast clock (FAST and complementary $\phi_{FAST}$) to resolve the bits instead of an internal fast clock as used in conventional SAR ADCs. This fast clock is provided by the first divider circuit 1600, which divides down the output of the VCO 1400 after processing by the AC coupling and level shifting circuit 1500. This results in savings in chip area and power.

The feedback clock $\phi_{FBCLK\_p}$ and $\phi_{FBCLK\_n}$) is slewed such that when it is sampled by the multi-bit SAR ADC 1110 at the reference clock ($\phi_{INREF}$) frequency, the difference (as provided by the digital subtractor 1130) between the sampled analog voltage and a digital threshold voltage is proportional to a phase difference between the feedback clock ($\phi_{FBCLK\_p}$ and $\phi_{FBCLK\_n}$) and the reference clock ($\phi_{INREF}$). In this instance, the digital threshold voltage is a digital code which can be system provided, user provided, or combinations thereof.

In particular, the multi-bit PFD is clocked at a lower speed to lock in phase and frequency at a rise/fall time of the feedback clock ($\phi_{FBCLK\_p}$ and $\phi_{FBCLK\_n}$) with the reference signal ($\phi_{INREF}$). In order to lock at the mid-range of the feedback rise time, the output of the multi-bit PFD is connected to the programmable digital subtractor 1130, which has a digital code applied to a negative sign input. The digital code is typically set to midrange. This digital code can be tuned to produce difference time-difference intervals (offset). Increasing the number of bits in the multi-bit PFD achieves better performance as the rise/fall time is digitized in $2^N$ levels.

In implementations, assuming that the digital threshold is around $V_{DD}/2$ (where $V_{SS}$=0 V) and there is no common mode offset, a most significant bit (MSB) of an output ($\Delta\phi$<4:0>) of the multi-bit SAR ADC 1110 indicates whether the sample of the feedback clock ($\phi_{FBCLK\_p}$ and $\phi_{FBCLK\_n}$) is above or below the common mode. Assuming the rising edge of the reference clock (($\phi_{INREF}$) is triggered at this same digital threshold voltage, the MSB indicates the direction of phase error and acts as a phase detector. In implementations, if the MSB is inverted before passing to the multi-bit DLPF 1200, the feedback loop will lock to the opposite edge. The remaining four bits provide additional phase error information, which makes the multi-bit SAR ADC 1110 a superior phase detector in comparison to a BBPFD, for example.

The remaining 4 LSBs of the output ($\Delta\phi<4:0>$) of the multi-bit SAR ADC 1110 can be manipulated to represent a magnitude of the phase error. In implementations, this can be determined by calculating either a 1 or 2's compliment of the amplitude difference from half the full-scale range of the 5-bit SAR ADC output, for example. In implementations, a 1's compliment version can be implemented using a digital XNOR gate for each of the 4 LSBs with the MSB. That is, each LSB is XNOR'd with the MSB. In implementations, subtracting a programmable value (denoted as "digital code") near midscale using 2's compliment allows for mitigation of common mode mismatches. Once the 4 bits represent the amplitude difference from midscale, the $\phi_{ERROR}$ can be used as inputs to the multi-bit DLPF 1200 to increase or decrease the effect of $K_I$ and $K_P$ as described herein.

The $\phi_{ERROR}$ is processed by the variable multi-bit proportional path gain ($K_P$) circuit 1210 and the variable multi-bit integral path gain ($K_I$) circuit 1220. In the variable multi-bit proportional path gain ($K_P$) circuit 1210, the value of $K_P$ or amount of gain applied to the $\phi_{ERROR}$ is controlled by the DLPF controller 1830 using the $CTRL_{SH\_Kp}$ control signal and as described herein. The variable multi-bit proportional path gain ($K_P$) circuit 1210 outputs a $K_P$ applied clock ($\phi_{KP}$) and an arbiter control bit ($ARB_{DAC}$) which controls whether the $K_P$ is bypassed or applied to the CS DAC 1300. The arbiter control bit ($ARB_{DAC}$) is the MSB of the ERROR as described herein. If the arbiter control bit is bit high, then the reference clock ($\phi_{INREF}$) is leading the feedback clock ($\phi_{FBCLK\_p}$ and $\phi_{FBCLK\_n}$) and the VCO 1400 needs to speed up.

In the variable multi-bit integral path gain ($K_I$) circuit 1220, the value of the $K_I$ or amount of gain applied to the $\phi_{ERROR}$ is controlled by the DLPF controller 1830 using the $CTRL_{SH\_Ki}$ control signal and as described herein. In the variable multi-bit integral path gain ($K_I$) circuit 1220, the reaction time of the accumulator 1224 is controlled by the DLPF controller 1830 by adjusting the frequency of the clock received from the multi-bit SAR ADC 1110 (denoted as $\phi_{DLPF}$). The variable multi-bit integral path gain ($K_I$) circuit 1220 outputs a $K_I$ applied clock ($\phi_{KI}$).

The variable multi-bit structure permits the multi-bit DLPF 1200, via the DLPF controller 1830, to apply the $K_P$ applied clock $\phi K_P$)) and the $K_I$ applied clock ($\phi_{KI}$) quickly to obtain lock (increase acquisition speed) in view of increased jitter. Once lock is obtained, then the multi-bit DLPF 1200, via the DLPF controller 1830 can decrease or bypass application (in the case of the $K_P$ applied clock ($\phi_{KP}$) to reduce jitter.

The outputs of the multi-bit DLPF 1200 including the arbiter control bit ($ARB_{DAC}$), the $K_P$ applied clock ($\phi_{KP}$), and the $K_I$ applied clock ($\phi_{KI}$), as appropriate, along with a bandwidth gain control ($K_Bw$) and a static direct current (DC) gain control ($K_{DC}$) are applied to the CS DAC 1300. The bandwidth gain control ($K_{BW}$) is a bandwidth control coefficient which determines a bandwidth of the SAR ADC based DPLL 1000. The static direct current (DC) gain control ($K_{DC}$) controls an amount of coarse frequency band tuning and accounts for temperature and processing variations during component manufacture and assembly. In implementation, the $K_{DC}$ and $K_{BW}$ are SAR ADC based DPLL 1000 control parameters.

The output of the CS DAC 1400 (a control current) is applied to the VCO 1400 to generate the output clock ($\phi_{our}$) via the AC coupling and level shifting circuit 1500. A frequency tuner 1840 can be used to coarsely tune the range of the VCO 1400. The output of the VCO 1400 can be processed through the AC coupling and level shifting circuit 1500 to meet logic level requirements. As noted, the POUT is input to the first divider 1600 to generate the fast clock (FAST and complementary $\phi_{FAST}$) for the multi-bit SAR ADC 1110. The output of the first divider 1600 is also an input to the second divider 1700. The output of the second divider 1700 is processed by the programmable rise/fall time circuit 1140.

The programmable rise/fall time circuit 1140 improves the dynamic range of the multi-bit SAR ADC 1110. In implementations, the rise/fall time of the feedback clock $\phi_{FBCLK\_p}$ and $\phi_{FBCLK\_n}$) is dynamically adjusted to optimize performance of the SAR ADC based DPLL 1000. The dynamic range (DR) is defined as $\Delta t$. The programmable rise/fall time circuit 1140 changes the slope of the feedback clock $\phi_{FBCLK\_p}$ and $\phi_{FBCLK\_n}$), where the slope is defined as Slope=$\Delta V/\Delta t$ [V/seconds] and $\Delta V$ is voltage resolution equal to $\Delta V/2^n$ [V/step] (n is the ADC resolution). This results in an LSB in the phase domain being defined as $$\frac{\text{Voltage resolution}}{\text{Slope}}$$

[sec/step]. Consequently, the LSB in the phase domain per DR equals to seconds per step, which defines the time resolution per step. By decreasing the rise/fall time (sharp rise/fall time), phase accuracy can be optimized for RMS jitter performance. In other words, control of the edge rate allows for fine tuning the performance in terms of jitter, phase noise, lock-time, and the like. For instance, slewing the rise/fall time of the feedback clock $\phi_{FBCLK\_p}$ and $\phi_{FBCLK\_n}$) increases the phase resolution at the expense of decreasing the lock range of the multi-bit PFD 1100. The programmed or slope-modified feedback clock ($\phi_{FBCLK\_p}$ and $\phi_{FBCLK\_n}$) is then input to the multi-bit SAR ADC 1110.

Figure 2:
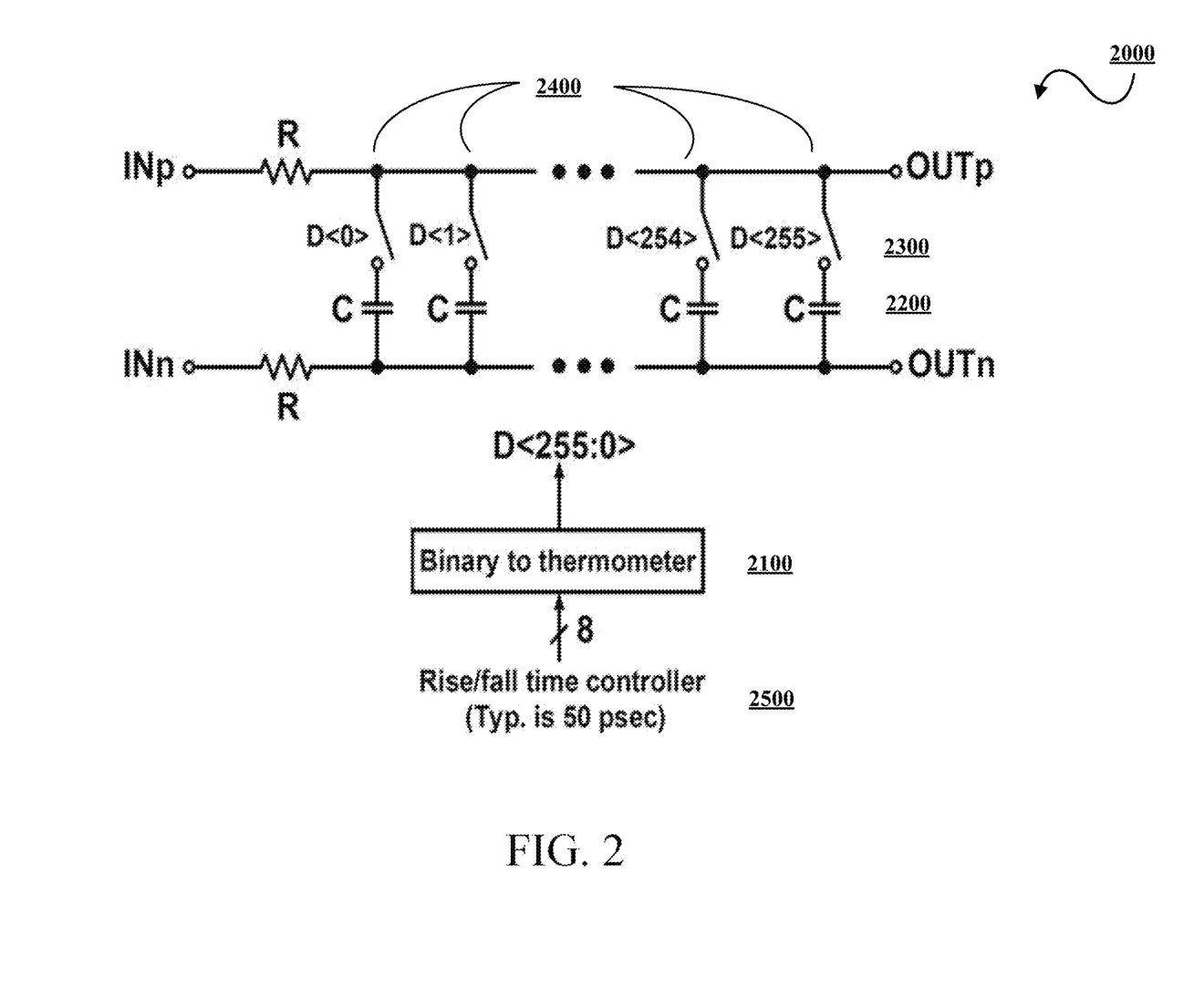
FIG. 2 is a block diagram of an example of a programmable range circuit in accordance with embodiments of this disclosure.

FIG. 2 is a block diagram of an example of a programmable range circuit or programmable rise/fall time circuit 2000 in accordance with embodiments of this disclosure. The programmable rise/fall time circuit 2000 includes a binary to thermometer block 2100, a chain of capacitors 2200, and a series of switches 2300 to change the rise/fall time of the feedback clock ($\phi_{FBCLK\_p}$ and $\phi_{FBCLK\_n}$). A control leg 2400 includes a capacitor in series with a switch. Each control leg 2400 is connected between an input clock ($IN_P$ and $IN_N$) (i.e., the second divider clock of FIG. 1) and an output clock ($OUT_P$ and $OUT_N$) (i.e., the feedback clock ($\phi_{FBCLK\_p}$ and $\phi_{FBCLK\_n}$) of FIG. 1). The programmable rise/fall time circuit 2000 is controlled by a programmable rise/fall time controller 2500.

Operationally, an N-bit digital code from the programmable rise/fall time controller 2500 is converted to an output code of $2^N$ bits. Each bit switching a control leg 2400 on or off to control the slope of the output clock ($OUT_P$ and $OUT_N$) (i.e., the feedback clock ($\phi_{FBCLK\_p}$ and $\phi_{FBCLK\_n}$) of FIG. 1). Various configuration can be achieved resulting in multiple controllable time constants $$\left(\tau = 2 \times R \times \sum_{i=0}^{255} Ci\right).$$

Figure 3:
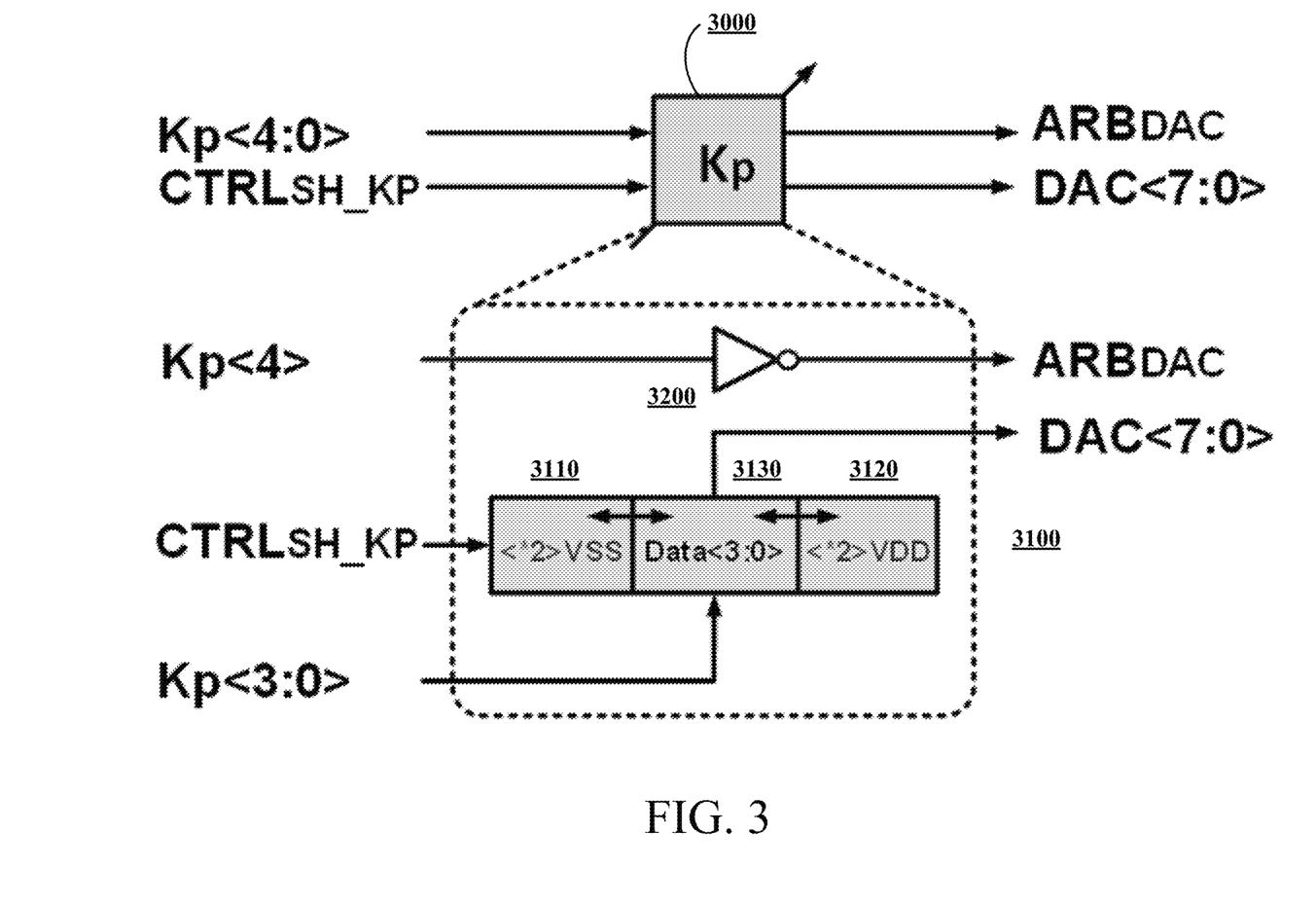
FIG. 3 is a block diagram of an example of a variable $K_P$ circuit in accordance with embodiments of this disclosure.

FIG. 3 is a block diagram of an example of a variable multi-bit $K_P$ circuit 3000 in accordance with embodiments of this disclosure. As described herein, the variable multi-bit $K_P$ circuit 3000 is controlled by the DLPF controller 1830 of FIG. 1 via a $CTRL_{SH\_KP}$ control signal. The variable multi-bit $K_P$ circuit 3000 operates on the ERROR (shown as $K_P$<4:0>) as determined by the digital subtractor 1130 of FIG. 1. The variable multi-bit $K_P$ circuit 3000 includes a shift register 3100 and an inverter 3200.

Operationally, the variable multi-bit $K_P$ circuit 3000 can provide variable fine resolution control of the VCO frequency. The shift register 3100 can produce or generate a variable $K_P$ by having an MSB side 3110 and an LSB side 3120 of the shift register 3100 set to a $V_{SS}$ and $V_{DD}$, respectively. The complemented four LSBs of the SAR ADC 1110 are loaded in as data in a middle section 3130 of the shift register 3100. The LSBs being set to $V_{DD}$ acts more as a "$K_{DC}$". The value of $K_P$ can be controlled by shifting the 4-bit data to the left or right to generate the output (DAC <7:0> or $\phi_{KP}$) of the variable multi-bit $K_P$ circuit 3000 to tune the VCO frequency at the desired value. It is noted that $K_P$ can never be zero since $V_{DD}$ is being in the shift register 3100. The inverter 3200 is used to generate the arbiter control bit ($ARB_{DAC}$) from the one-bit MSB of the $\phi_{ERROR}$.

Figure 4:
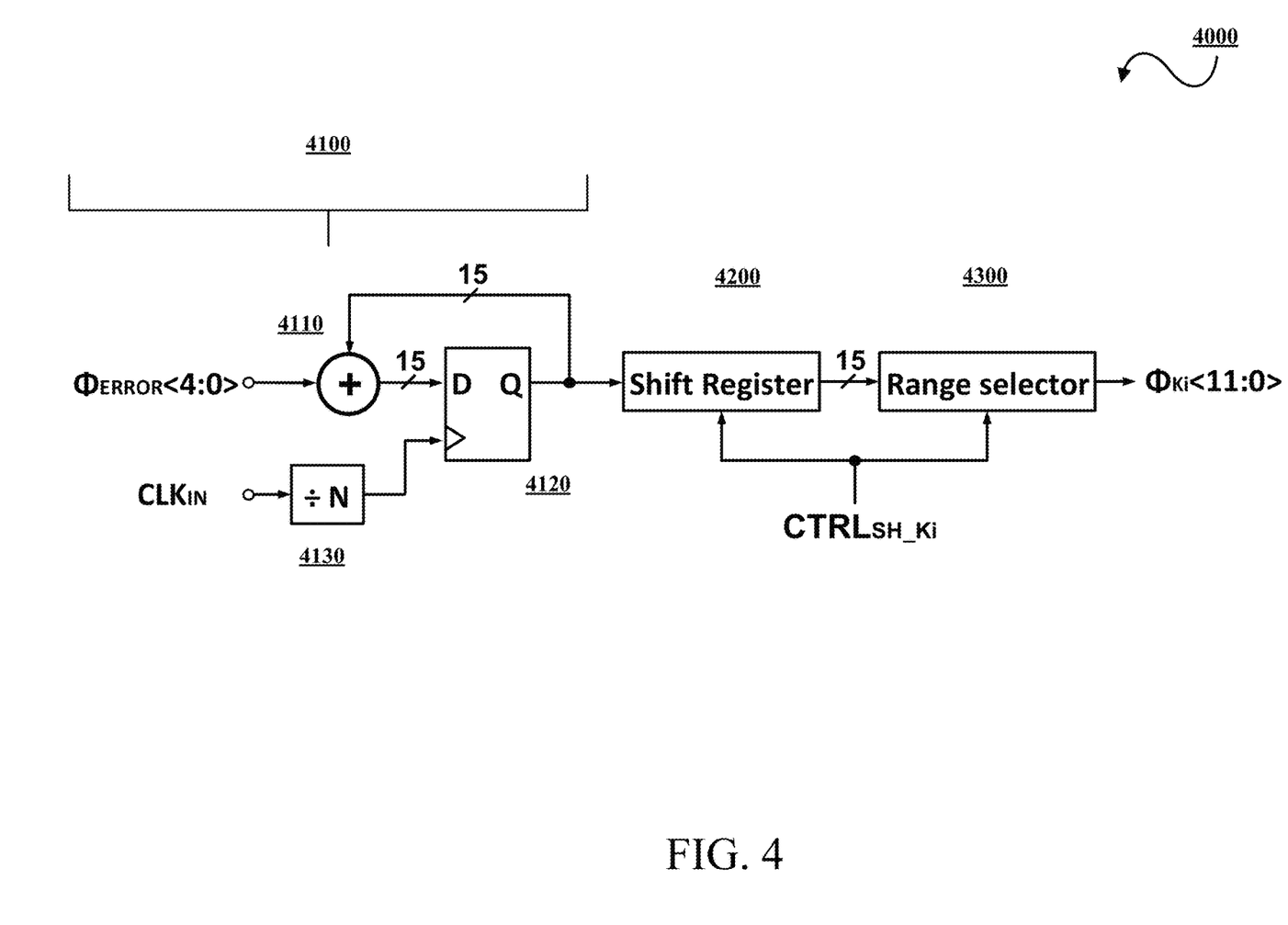
FIG. 4 is a block diagram of an example of a variable multi-bit $K_I$ circuit in accordance with embodiments of this disclosure.

FIG. 4 is a block diagram of an example of a variable multi-bit ICI circuit 4000 in accordance with embodiments of this disclosure. As described herein, the variable multi-bit ICI circuit 4000 is controlled by the DLPF controller 1830 of FIG. 1 via a $CTRL_{SH\_Ki}$ control signal. The DLPF controller 1830 also controls the operational clock frequency of the variable multi-bit ICI circuit 4000. The variable multi-bit ICI circuit 4000 operates on the $\phi_{ERROR}$ as determined by the digital subtractor 1130 of FIG. 1. The variable multi-bit ICI circuit 4000 includes an accumulator 4100, a shift register 4200, and a range selector 4300. The accumulator 4100 includes a summer 4110, a D flip-flop 4120, and a divider 4130.

Operationally, the variable multi-bit ICI circuit 4000 can provide variable fine resolution control of the VCO frequency. The divider 4130 generates an accumulator clock from an input clock ($CLK_{IN}$) (i.e., the $\phi_{DLPF}$ of FIG. 1) as controlled by the DLPF controller 1830. The divider 4130 as controlled by the DLPF controller 1830 permits fine control of the SAR ADC based DPLL 1000 loop dynamically with respect to acquisition and settling time. This additional control can be set to initially provide fast settling time, and once the loop is locked, it can be set to minimize jitter. The output of the accumulator 4100 is processed by the shift register 4200 (using the $CTRL_{SH\_Ki}$ control signal) as described with respect to the shift register 3100. The output of the shift register 4200 is then processed through the range selector 4300 as controlled by the $CTRL_{SH\_Ki}$ control signal to generate the output ((km) of the variable multi-bit ICI circuit 4000 to tune the VCO frequency at the desired value.

Figure 5:
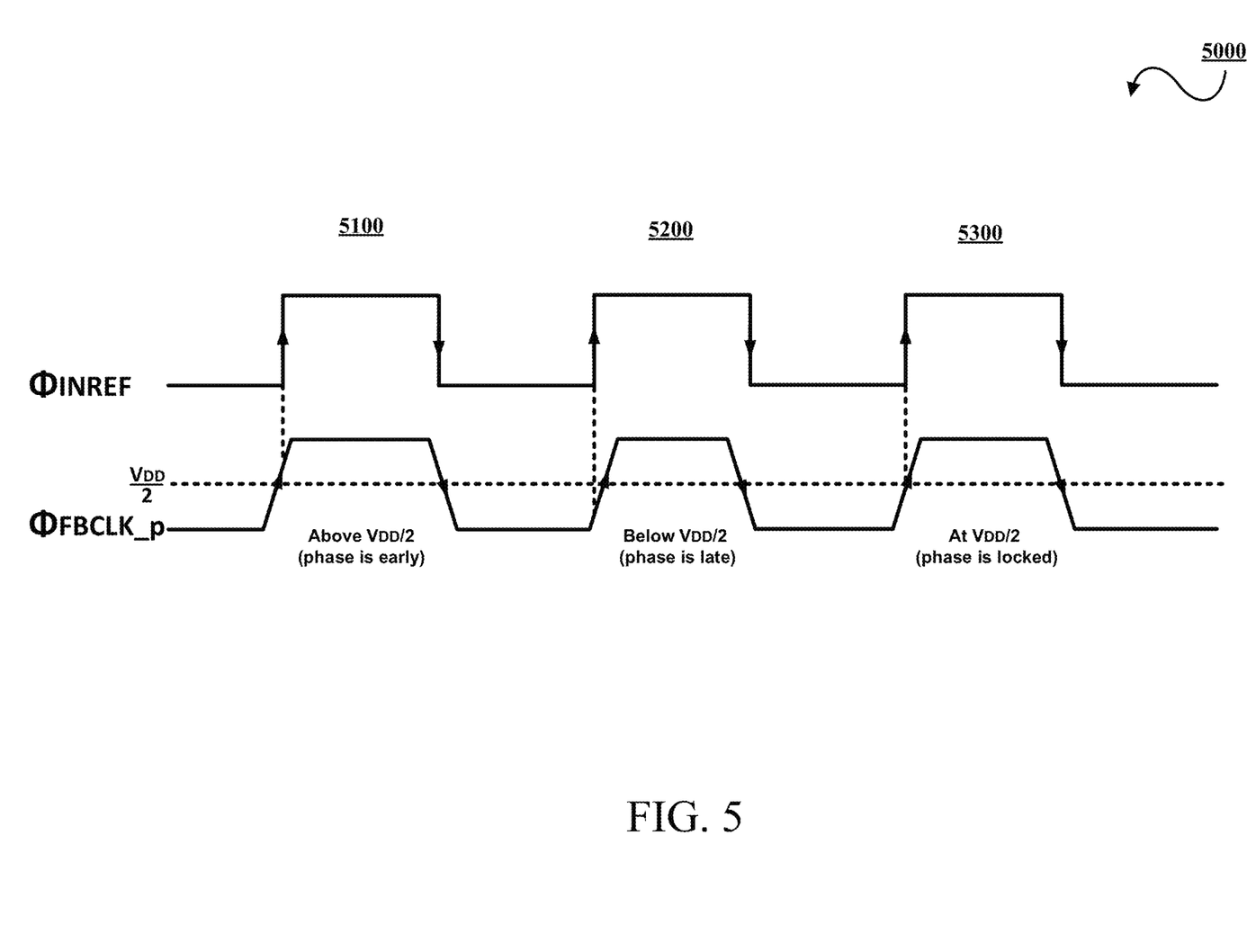
FIG. 5 is a graph of an example SAR ADC based DPLL with programmable range operation in accordance with embodiments of this disclosure.

FIG. 5 is a graph 5000 of an example SAR ADC based DPLL with programmable range operation in accordance with embodiments of this disclosure. As noted, the output of the second divider clock 1700 is slewed by the programmable rise/fall time circuit 1140 such that when the feedback clock ($\phi_{FBCLK\_p}$ and $\phi_{FBCLK\_n}$) is sampled by the multi-bit SAR ADC 1110 at the reference clock frequency, the difference between the sampled analog voltage of the feedback clock ($\phi_{FBCLK\_p}$ and $\phi_{FBCLK\_n}$) and the digital threshold voltage is proportional to the phase difference between the feedback clock ($\phi_{FBCLK\_p}$ and $\phi_{FBCLK\_n}$) and the reference clock. If digital threshold is around $V_{DD}/2$ ($V_{SS}=0$ V) as shown and no common mode offset, the MSB of the multi-bit SAR ADC 1110 output indicates whether the sample of the feedback clock ($\phi_{FBCLK\_p}$ and $\phi_{FBCLK\_n}$) is above or below the common mode. Assuming the rising edge of the reference clock ($\phi_{INREF}$) is triggered at this same threshold voltage, the MSB indicates the direction of phase error and acts as a phase detector. Accordingly, section 5100 of the graph 5000 shows the phase of the feedback clock ($\phi_{FBCLK\_p}$ and $\phi_{FBCLK\_n}$) is early, section 5200 of the graph 5000 shows the phase of the feedback clock ($\phi_{FBCLK\_p}$ and $\phi_{FBCLK\_n}$) is late, and section 5300 of the graph 5000 shows the phase of the feedback clock ($\phi_{FBCLK\_p}$ and $\phi_{FBCLK\_n}$) is locked with the reference clock ($\phi_{INREF}$).

Figure 6:
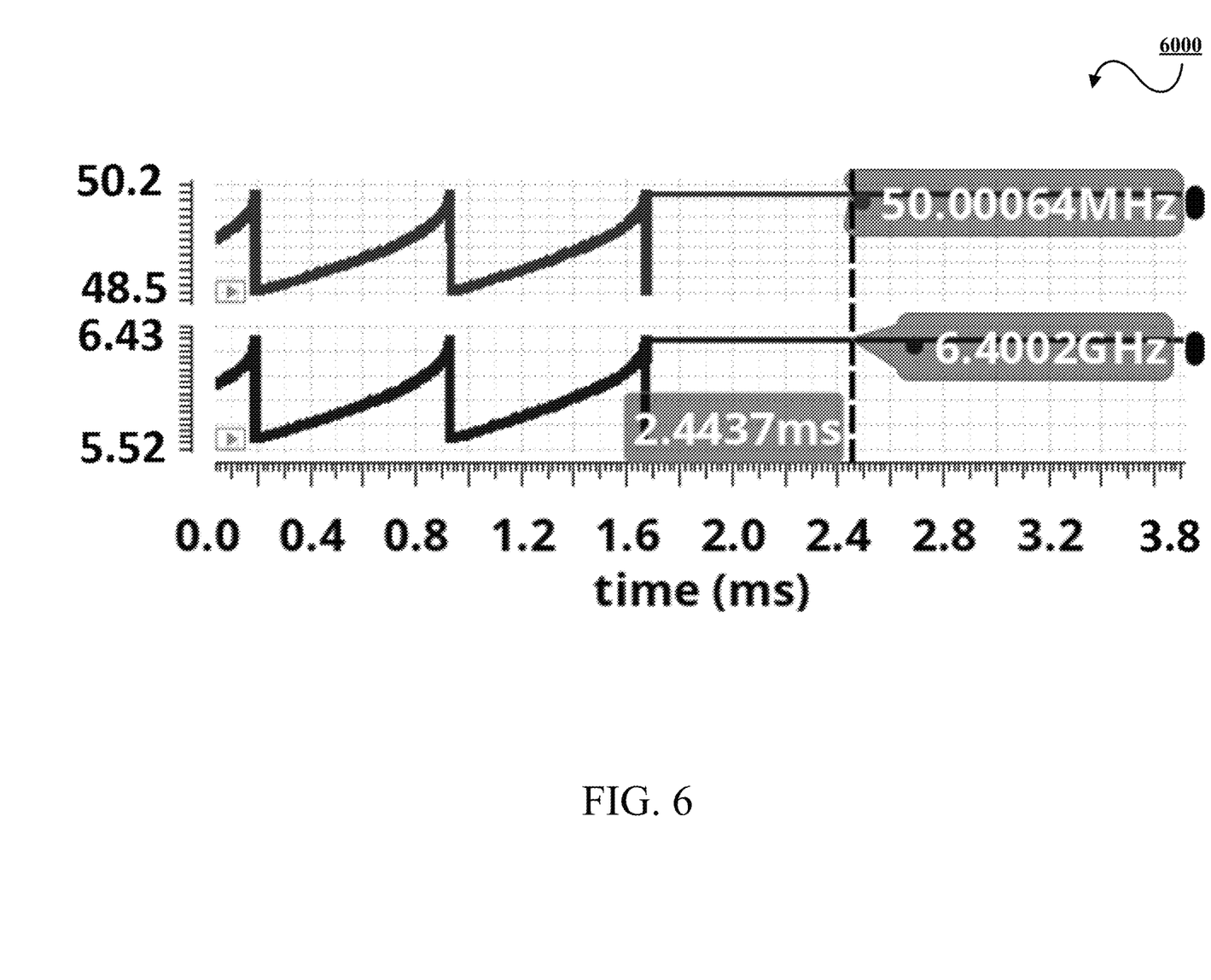
FIG. 6 is a graph of example simulated input and output frequencies of the SAR ADC based DPLL with programmable range in accordance with embodiments of this disclosure.

FIG. 6 is a graph 6000 of example simulated input and output frequencies of the SAR ADC based DPLL with programmable range in accordance with embodiments of this disclosure. In this instance, the frequency of the reference clock $\phi$INREF) is set at 50.00064 MHz and the frequency of the output (our) generated by a SAR ADC based DPLL is 6.4 GHz.

Figure 7:
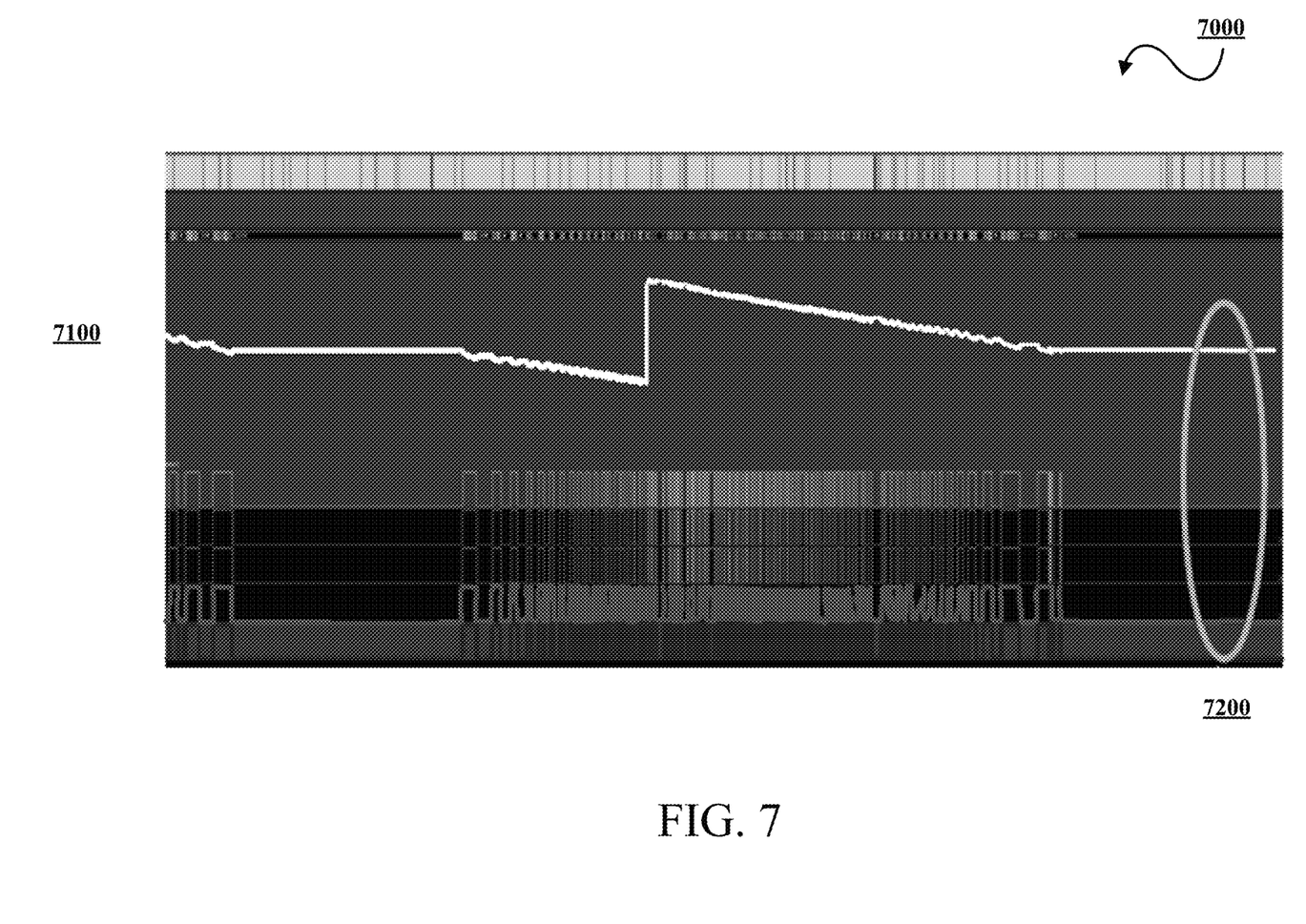
FIG. 7 is a timing diagram graph of an example simulated non-return zero (NRZ) input to the SAR ADC based DPLL with programmable range in accordance with embodiments of this disclosure.
Figure 8:
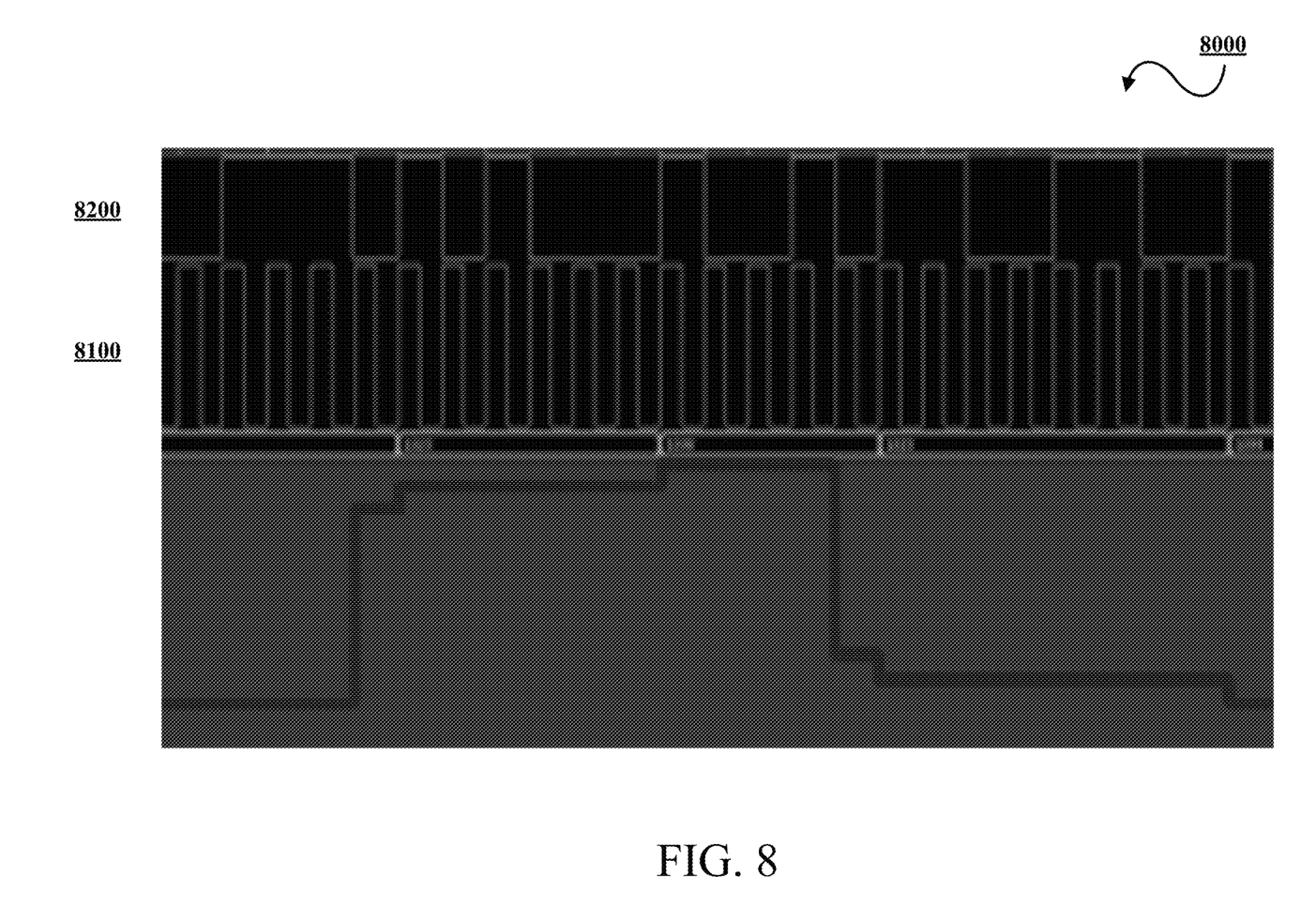
FIG. 8 is a timing diagram graph of an example simulated non-return zero (NRZ) input to the SAR ADC based DPLL with programmable range in a locked state in accordance with embodiments of this disclosure.

FIG. 7 is a timing diagram graph 7000 of an example simulated non-return zero (NRZ) input to the SAR ADC based DPLL with programmable range in accordance with embodiments of this disclosure. FIG. 8 is a timing diagram graph 8000 of an example simulated non-return zero (NRZ) input to the SAR ADC based DPLL with programmable range in a locked state in accordance with embodiments of this disclosure As noted, the SAR ADC based SPLL can track the phase and frequency with a programmable range used in MI_ and CDR applications. FIG. 7 uses a Non-Return to Zero (NRZ) signal 7100 as a random input reference clock. The circled portion 7200 (which is shown as the graph 8000 in FIG. 8) shows that the feedback signal 8100 is phase and frequency locked to the input NRZ signal 8200.

Figure 9:
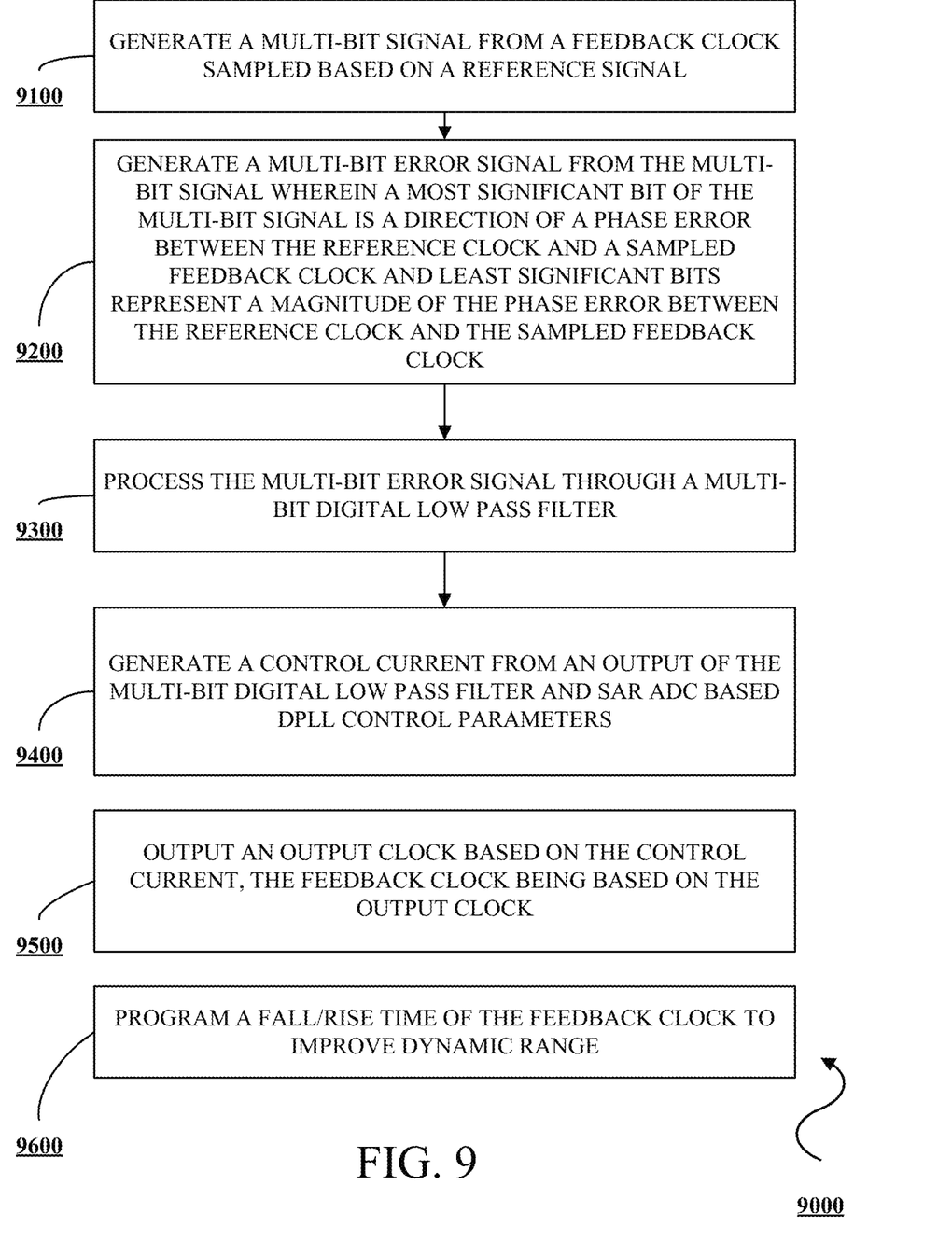
FIG. 9 is a flowchart of an example technique for SAR ADC based DPLL with programmable range operation in accordance with embodiments of this disclosure.

FIG. 9 is a flowchart of an example technique 9000 for SAR ADC based DPLL with programmable range operation in accordance with embodiments of this disclosure. The method 9000 includes: generating 9100 a multi-bit signal from a feedback clock sampled based on a reference signal; generating 9200 a multi-bit error signal from the multi-bit signal wherein a most significant bit of the multi-bit signal is a direction of a phase error between the reference clock and a sampled feedback clock and least significant bits represent a magnitude of the phase error between the reference clock and the sampled feedback clock; processing 9300 the multi-bit error signal through a multi-bit digital low pass filter; generating 9400 a control current from an output of the multi-bit digital low pass filter and SAR ADC based DPLL control parameters; outputting 9500 an output clock based on the control current, the feedback clock being based on the output clock; and programming 9600 a fall/rise time of the feedback clock to improve dynamic range. The method 9000 can be implemented by the SAR ADC based DPLL 1000 of FIG. 1, a programmable range circuit or programmable rise/fall time circuit 2000 of FIG. 2, a variable multi-bit $K_P$ circuit 3000 of FIG. 3, and a variable multi-bit $K_I$ circuit 4000 of FIG. 4, as appropriate and applicable.

The method 9000 includes generating 9100 a multi-bit signal from a feedback clock sampled based on a reference signal. A multi-bit SAR ADC uses a duty controlled reference signal to obtain samples of the feedback clock. A fast clock is generated from the output clock of the SAR ADC based DPLL to resolve the sampled feedback clock and generate the multi-bit signal.

The method 9000 includes generating 9200 a multi-bit error signal from the multi-bit signal wherein a most significant bit of the multi-bit signal is a direction of a phase error between the reference clock and a sampled feedback clock and least significant bits represent a magnitude of the phase error between the reference clock and the sampled feedback clock. The multi-bit signal is digitally subtracted with a digital code. The digital code represents a digital threshold voltage which when subtracted from the multi-bit signal is proportional to the phase difference between the feedback clock and the reference clock. The direction of the phase error can be determined by triggering the edge of the reference clock $\phi_{INREF}$) at the same time as the digital threshold voltage. The phase error can be determined from the remaining bits of the multi-bit signal, i.e., the least significant bits, using a 1's or 2's complement subtraction.

The method 9000 includes processing 9300 the multi-bit error signal through a multi-bit digital low pass filter. The multi-bit digital low pass filter includes a multi-bit proportional gain ($K_P$) path and a multi-bit integral ($K_I$) gain path. The amount of $K_P$ gain is controlled by a digital low pass filter. The output of the multi-bit proportional gain ($K_P$) path includes an arbiter control signal based on the most significant bit of the multi-bit error signal. The arbiter control signal indicates whether the $K_P$ is applied at a CS DAC as part of the control current. If the arbiter control signal is high, then the reference clock ($f_{INREF}$) is leading the feedback clock ($\phi_{FBCLK\_p}$ and $\phi_{FBCLK\_n}$) and the VCO needs to speed up and the $K_P$ is applied. The multi-bit integral ($K_I$) gain path includes an accumulator and a $K_I$ gain. The amount of $K_I$ gain is controlled by a digital low pass filter. The accumulator reaction time is controlled by the DLPF controller by adjusting the frequency of a clock received from the multi-bit SAR ADC. This effectively controls lock acquisition speed of the SAR ADC based DPLL.

The method 9000 includes generating 9400 a control current from an output of the multi-bit digital low pass filter and SAR ADC based DPLL control parameters. The CS DAC uses the $K_P$ and the $K_I$ as well as a bandwidth gain control ($K_B$w) and a static direct current (DC) gain control ($K_{DC}$) to generate the control current for the VCO.

The method 9000 includes outputting 9500 an output clock based on the control current, where the feedback clock is based on the output clock. The control current is applied to the VCO, which in turn generates the output clock. In implementations, the VCO is coarsely tuned using a frequency tuner.

The method 9000 includes programming 9600 a fall/rise time of the feedback clock to improve dynamic range. A programmable rise/time generator adjusts a divided output clock to generate the feedback clock. The output clock is processed through at least one divider. The amount of slope adjustment is system controlled based on application, requirements, and other factors.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A multi-bit digital phase locked loop comprising:
    a multi-bit phase frequency detector configured to output a multi-bit error signal based on a reference clock, a feedback clock sampled using the reference clock, and a threshold voltage;
    a multi-bit digital low pass filter connected to the multi-bit phase frequency detector, the multi-bit digital low pass filter configured to apply a variable gain to the multi-bit error signal;
    a current steered digital-to-analog converter connected to the multi-bit digital low pass filter, the current steered digital-to-analog converter configured to generate a control current based on a gain applied multi-bit error signal and multi-bit digital phase locked loop control parameters;
    a controlled oscillator connected to the current steered digital-to-analog converter, the controlled oscillator configured to adjust a frequency of the controlled oscillator based on the control current to generate an output clock, the feedback clock being based on the output clock; and
    a programmable edge time controller configured to adjust a slope of an edge of the feedback clock.

2. The multi-bit digital phase locked loop of claim 1, wherein the multi-bit phase frequency detector comprises a multi-bit successive approximation register (SAR) analog-to-digital (ADC) configured to sample the feedback clock using the reference clock at a defined duty cycle and to resolve the sampled frequency clock to generate a multi-bit signal based on a fast clock.

3. The multi-bit digital phase locked loop of claim 2, further comprising a divider configured to divide the output clock to generate the fast clock.

4. The multi-bit digital phase locked loop of claim 2, wherein the multi-bit phase frequency detector comprises a digital subtractor configured to subtract a digital code representative of the threshold voltage from the multi-bit signal to generate the multi-bit error signal.

5. The multi-bit digital phase locked loop of claim 1, wherein the multi-bit digital low pass filter comprises
    a variable multi-bit proportional path gain ($K_P$) circuit configured to apply a $K_P$ to the multi-bit error signal to generate a $K_P$ gain applied multi-bit error signal and to generate an arbiter control bit from a most significant bit of the multi-bit error signal, wherein the arbiter control bit governs application of the $K_P$ gain applied multi-bit error signal at the current steered digital-to-analog converter; and
    a variable multi-bit integral path gain ($K_I$) circuit configured to apply a $K_I$ to the multi-bit error signal to generate a $K_I$ gain applied multi-bit error signal,
    wherein the gain applied multi-bit error signal includes at the $K_P$ gain applied multi-bit error signal and the $K_I$ gain applied multi-bit error signal, and
    wherein the variable multi-bit proportional path gain ($K_P$) circuit and the variable multi-bit integral path gain ($K_I$) circuit are controlled by a digital low pass filter controller.

6. The multi-bit digital phase locked loop of claim 5, wherein the variable multi-bit integral path gain ($K_I$) circuit comprises
    an accumulator configured to integrate a phase error from the multi-bit error signal, wherein a reaction time of the accumulator is controlled by the digital low pass filter controller; and
    a variable multi-bit integral path gain ($K_I$) configured to apply the $K_I$ to an output of the accumulator to generate the $K_I$ gain applied multi-bit error signal.

7. The multi-bit digital phase locked loop of claim 6, wherein the multi-bit phase frequency detector provides a clock signal for the accumulator which is controlled by the digital low pass filter controller based on trading off jitter versus acquisition time.

8. The multi-bit digital phase locked loop of claim 5, wherein the variable multi-bit proportional path gain ($K_P$) circuit and the variable multi-bit integral path gain ($K_I$) circuit each comprise a shift register, wherein a most significant bit section is set to ground or 0 volts, a least significant bit section is set to positive supply voltage, and a middle section is set to least significant bits of the multi-bit error signal.

9. The multi-bit digital phase locked loop of claim 1, wherein the programmable edge time controller comprises a binary-to-thermometer circuit connected to a plurality of switched capacitor legs, wherein the binary-to-thermometer circuit is configured to convert a N-bit digital code from an edge time controller into $2^N$ bits, each bit controlling one switched capacitor leg of the plurality of switched capacitor legs.

10. The multi-bit digital phase locked loop of claim 1, further comprising a duty cycle controller configured to provide the reference clock at the defined duty cycle.

11. A N-bit digital phase locked loop comprising:
    a N-bit phase frequency detector to output a N-bit error signal based on a reference clock, a feedback clock, and a digital threshold code;

a controlled oscillator configured to adjust a frequency of the controlled oscillator based on the N-bit error signal to generate an output clock, the feedback clock being based on the output clock; and a programmable rise/fall time controller in a feedback path of the N-bit digital phase locked loop configured to adjust a slope of the rise/fall time of the feedback clock to improve dynamic range.

12. The N-bit digital phase locked loop of claim 11, wherein the N-bit phase frequency detector comprises a N-bit successive approximation register (SAR) analog-to-digital (ADC) configured to sample the feedback clock using the reference clock at a defined duty cycle and to resolve the sampled frequency clock to generate a N-bit signal based on a fast clock provided by dividing the output clock, and a digital subtractor configured to subtract the digital threshold code from the N-bit signal to generate the N-bit error signal.

13. The N-bit digital phase locked loop of claim 11, further comprising a current steered digital-to-analog converter configured to generate a control current based on a gain applied N-bit error signal and N-bit digital phase locked loop control parameters.

14. The N-bit digital phase locked loop of claim 11, further comprising
a N-bit digital low pass filter configured to apply a variable gain to the multi-bit error signal.

15. The N-bit digital phase locked loop of claim 14, wherein the N-bit digital low pass filter comprises
a variable N-bit proportional path gain ($K_P$) circuit configured to generate a $K_P$ gain applied multi-bit error signal and to generate an arbiter control bit from a most significant bit of the multi-bit error signal, wherein the arbiter control bit governs application of the $K_P$ gain applied multi-bit error signal at a current steered digital-to-analog converter; and
a variable multi-bit integral path gain ($K_I$) circuit configured to generate a $K_I$ gain applied multi-bit error signal using at least an accumulator having a clock provided by the N-bit phase frequency detector,
wherein the variable multi-bit proportional path gain ($K_P$) circuit, the variable multi-bit integral path gain ($K_I$) circuit, and the clock are controlled by a digital low pass filter controller which accounts for jitter and acquisition time.

16. The N-bit digital phase locked loop of claim 11, wherein the programmable rise/fall time controller comprises a binary-to-thermometer circuit connected to a plurality of switched capacitor legs, wherein the binary-to-thermometer circuit is configured to convert a N-bit digital code from an edge time controller into $2^N$ bits, each bit controlling one switched capacitor leg of the plurality of switched capacitor legs.

17. A method comprising:
generating a multi-bit signal from a feedback clock sampled based on a reference signal;
generating a multi-bit error signal from the multi-bit signal, wherein a most significant bit of the multi-bit signal is a direction of a phase error between the reference clock and a sampled feedback clock and least significant bits represent a magnitude of the phase error between the reference clock and the sampled feedback clock;
processing the multi-bit error signal through a multi-bit digital low pass filter;
generating a control current from an output of the multi-bit digital low pass filter and control parameters;
outputting an output clock based on the control current, the feedback clock being based on the output clock; and
programming a fall/rise time of the feedback clock to improve dynamic range.

18. The method of claim 17, the generating a multi-bit error signal further comprises subtracting a digital code from the multi-bit signal, the digital code representing a digital threshold voltage which when subtracted from the multi-bit signal is proportional to a phase error between the feedback clock and the reference clock.

19. The method of claim 17, wherein the processing the multi-bit error signal through a multi-bit digital low pass filter further comprises
applying a multi-bit proportional gain to the multi-bit error signal; and
applying a multi-bit integral gain to the multi-bit error signal,
wherein gain and application of the multi-bit proportional gain and the multi-bit integral gain is controlled based on jitter and acquisition time requirements.

20. The method of claim 17, wherein the generating a control current comprises including multi-bit proportional gain when a control bit indicates that reference clock is leading the feedback clock.

* * * * *